United States Patent
Blatchford

(10) Patent No.: US 8,138,074 B1
(45) Date of Patent: Mar. 20, 2012

(54) ICS WITH END GATES HAVING ADJACENT ELECTRICALLY CONNECTED FIELD POLY

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 12/939,738

(22) Filed: Nov. 4, 2010

(51) Int. Cl.
*H01L 21/00* (2006.01)

(52) U.S. Cl. ........ 438/586; 438/795; 438/689; 438/710; 438/725; 438/736; 438/292; 438/308; 257/368; 257/401; 257/288; 257/901; 257/E21.575; 257/E21.001; 257/E21

(58) Field of Classification Search ................ 438/586, 438/795, 689, 710, 725, 736, 292, 308; 257/368, 257/401, 288, 901, E21.575, E21.001, E21
See application file for complete search history.

(56) References Cited

U.S. PATENT DOCUMENTS

| 2007/0105387 A1* | 5/2007 | Blatchford et al. ........... 438/710 |
| 2008/0166889 A1* | 7/2008 | Rathsack et al. .............. 438/795 |

* cited by examiner

*Primary Examiner* — Marc Armand
(74) *Attorney, Agent, or Firm* — Jacqueline J. Garner; Wade J. Brady, III; Frederick J. Telecky, Jr.

(57) ABSTRACT

A method of forming an IC includes forming a first and a second gate portion using a poly mask. The first portion includes a first active poly gate having a line width $W_1$ over an end of a first active area framed by a first active area edge and a first adjacent active field poly feature having a line width $0.8W_1$ to $1.3W_1$ in a first field region. The first field poly feature has a horizontal portion and a first extension portion along a gate width direction extending over the first active area edge having a first minimum spacing ($S_1$). The second gate portion includes a second active poly gate over an end of a second active area framed by a second active area edge electrically connected to a second field poly feature in a second field region having a horizontal portion and a second extension portion along a gate width direction extending over the second active area edge having a second minimum spacing ($S_2$). A dummy field poly feature is between the second active poly gate and the second field poly feature. $S_1 \geq 1.25 S_2$.

15 Claims, 4 Drawing Sheets

ICS WITH END GATES HAVING ADJACENT ELECTRICALLY CONNECTED FIELD POLY

FIELD

Disclosed embodiments relate to integrated circuits (ICs) including semiconductor fabrication, and more particularly to gate level photolithography for forming IC devices and IC devices therefrom.

BACKGROUND

Lithographic projection apparatus (tools) can be used, for example, in the manufacture of ICs. When using the various tools, a mask can be used that contains a circuit pattern corresponding to an individual layer of the IC, and this pattern, usually having many designs, can be imaged onto a target portion (e.g., comprising one or more dies) on a substrate, such as a silicon wafer or other wafer comprising a semiconductor surface, that has been coated with a layer of radiation-sensitive material, such as a resist. In general, a single wafer may contain a network of adjacent target portions that can be successively irradiated using a projection system of the tool, one at a time.

One of the goals in IC fabrication is to faithfully reproduce the original IC design on the wafer using the mask. Another goal is to use as much of the wafer area as possible. As the size of an IC is reduced and its density increases, however, the critical dimension (CD) of its corresponding mask approaches the resolution limit of the optical exposure tool. The resolution for an exposure tool can be defined as the minimum feature sizes that the exposure tool can repeatedly expose on the wafer. The resolution value of exposure tools often constrains the minimum CD for many advanced IC designs.

A particularly important fabrication process employed in IC fabrication that includes metal-oxide-semiconductor (MOS) transistors is the gate electrode (hereafter the "gate") level etch process, such as the polysilicon (poly) gate etch process, which is commonly utilized for forming MOS transistors. The gate etch process is important in terms of device operation and CDs. Better or tighter control of the gate etch process results in benefits including better device characteristics, improved device performance, and/or improved device yield. Collectively these benefits improve device yield and/or produce devices with additional intrinsic value (e.g., better performance, lower heat dissipation, lowered leakage current). Thus, a stable, accurate and precise gate etch process for MOS transistors is important.

For the gate level for advanced nodes (e.g. ≦42 nm line widths), use of dummy (i.e., electrically unconnected) field poly assist features adjacent to end gates in gate arrays is known to help improve CD uniformity for the active end gate. As used herein, a dummy feature is electrically isolated (i.e. disconnected) from the active circuitry on the IC.

SUMMARY

Disclosed embodiments describe ICs including end poly gates having adjacent electrically connected field poly features that maintain gate dielectric integrity. As used herein, "adjacent" refers to no intervening poly features between the end poly gate and the electrically connected field poly feature. The ability to utilize adjacent field poly features in the IC as electrically connected features, such as for interconnects, besides providing conventional gate pitch matching, increases IC density as compared to gate layouts that use adjacent dummy field poly features to avoid creating leakage/shorts to the topside semiconductor surface. Disclosed embodiments generally include a gate portions having minimum spacing between the adjacent electrically connected field poly features where they have an extension portion that extends over an edge portion of the active area edge to prevent the electrically connected field poly features from crossing or being near active area corners which the Inventor has recognized can help avoid the adjacent electrically connected field poly features from generating leakage/shorts to the topside semiconductor surface.

DETAILED DESCRIPTION

Figure 1:
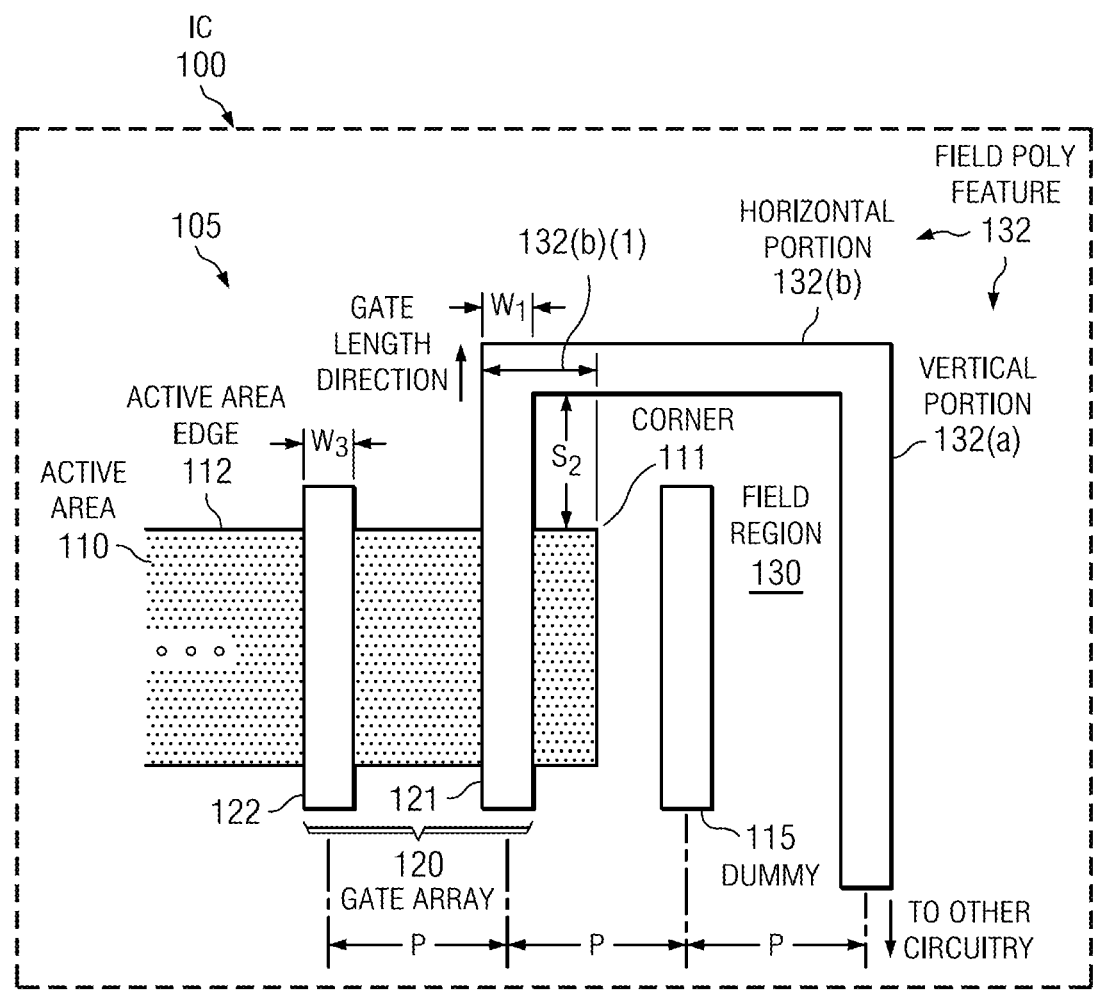
FIG. 1 is a simplified depiction of a printed poly gate level portion within an integrated circuit (IC) after gate patterning comprising an active area including a gate array comprising active poly gates and a dummy field poly feature adjacent to the end poly gate in the gate array, according to a disclosed embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a simplified depiction of a printed poly gate level portion 105 within an IC 100 after gate patterning comprising an active area 110 including a gate array 120 comprising first and second active poly features 121, 122, and a dummy (i.e., electrically unconnected) field poly feature 115 in the field region 130 adjacent to the first active poly feature 121, which is an end gate in the gate array 120, according to a disclosed embodiment. Active area 110 is shown being rectangular in shape including active area edges 112 and corners 111. First active poly feature 121 and a second active poly feature 122 define a pitch (a center-to-center pitch) shown as P for the gate array 120, with the respective active poly features 121, 122 each having a line width W. The dummy field poly feature 115 in the field region 130 may be on trench isolation, and is shown positioned to maintain the pitch P in gate array 120.

Gate level portion 105 also includes an electrically connected field poly feature 132 in the field region 130 having a vertical portion 132(a) that is along a gate length direction of the first active poly feature 121 and a horizontal portion 132(b) that is along the gate width direction of the first active poly feature 121 including a second extension portion (132(b)(1)) that extends over the active area edge 112. A second minimum spacing ($S_2$) in the gate length direction is shown between the second extension portion 132(b)(1) and the active area edge 112.

Since the dummy poly feature 115 is electrically isolated (floating) relative to the active circuitry on the IC 100, gate level portion 105 avoids electrical problems including gate dielectric (e.g., gate oxide) leakage or shorts between the dummy field poly feature 115 and the semiconductor surface (e.g., silicon), particularly in locations on the IC 100 where the dummy field poly feature 115 crosses a corner 111 of the active area 110. Although the gate level portion 105 shown in FIG. 1 avoids dummy field poly feature 115 induced gate dielectric leakage/shorts to the semiconductor surface, such layouts decrease IC density since the dummy field poly feature 115 does not provide any circuit function for the IC 100.

Figure 2A:
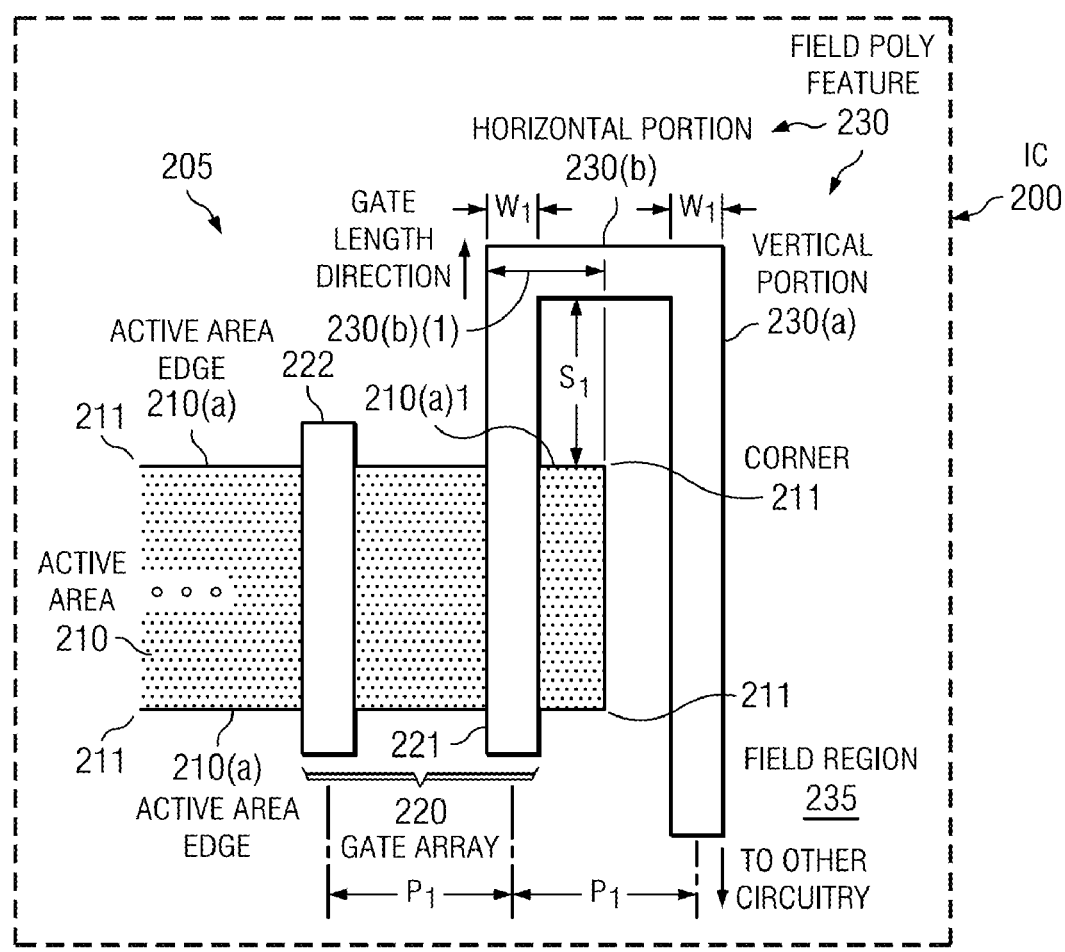
FIG. 2A is a simplified depiction of a printed poly gate level portion within an IC after gate patterning including a plurality of MOS transistors including adjacent electrically connected field poly features for gate pitch matching that maintain gate dielectric integrity, according to a disclosed embodiment.

FIG. 2A is a simplified depiction of a printed poly gate level portion 205 within an IC 200 after gate patterning including a plurality of MOS transistors including adjacent electrically connected field poly features for gate pitch matching that maintain gate dielectric integrity, according to a disclosed embodiment. A gate mask corresponding to the layout of poly gate level portion 205 together with lithography as known in the art can be used to form the gate level features shown in FIG. 2A and other gate level features disclosed herein.

Poly gate level portion 205 includes at least a first active poly gate feature 221 having a line width $W_1$ over an end of an active area 210, so that first active poly gate feature 221 is an end gate in gate array 220. Active area 210 is shown having an example rectangular shape and includes corners 211 and active area edges 210(a). Active areas can have shapes other than rectangular. A second active poly gate feature 222 shown in FIG. 2A is an interior gate in gate array 220. An adjacent electrically connected field poly feature 230 having a line width in the gate width direction of $0.8W_1$ to $1.3W_1$ is shown in FIG. 2A having a width=$W_1$ and is over a field region 235, such as over trench isolation (e.g., shallow trench isolation (STI)).

Adjacent electrically connected field poly feature 230 is shown including vertical portion 230(a) that is along the gate length direction of the first poly gate feature 221 and a horizontal portion 230(b) that is along the gate width direction of the first poly gate feature 221. Adjacent electrically connected field poly feature 230 is electrically connected by horizontal portion 230(b) to the first active poly gate 221, and also couples first active poly gate feature 221 to other circuitry on the IC 200, such as to another MOS transistor. Thus, in the embodiment shown in FIG. 2A, the adjacent electrically connected field poly feature 230 is electrically connected to the same active poly gate (first poly gate feature 221) that it provides a gate assist function for.

Adjacent electrically connected field poly feature 230 is shown positioned to provide pitch $P_1$, shown as the same the pitch in gate array 220 in FIG. 2A between first active poly gate 221 and second active poly gate 222. Adjacent electrically connected field poly feature 230 is more generally positioned to provide a pitch that maintains the gate pitch $P_1$ in gate array 220. As used herein "maintaining a gate pitch" refers to adjacent electrically connected field poly feature 230 positioned to provide a narrow pitch range so that a regular (fixed) pitch is provided that follows the pitch in gate array 220, or at least a near-regular pitch defined herein as being within 15% of the pitch in gate array 220.

Horizontal portion 230(b) includes an extension portion 230(b)(1) that extends over an edge portion 210(a)(1) of the active area edge 210(a). A spacing shown as $S_1$, referred to herein as a first minimum spacing, is the distance in the gate length direction between the extension portion 230(b)(1) and the edge portion 210(a)(1). The minimum $S_1$ is generally limited by the optical resolution and overlay requirements, and in one embodiments is $\geq \lambda$(wavelength)/4NA (numerical aperture)+an overlay tolerance of a scanner used for the forming of the gate level features.

$S_1$ is generally $\geq 2.5 W_1$, so for example, when $W_1$=36 nm, $S_{1min} \geq 90$ nm, such as around 100 nm. For comparison to ICs including dummy adjacent field poly features, such as shown in FIG. 1, $S_1 \geq 1.25 S_2$. This increased spacing $S_1$ of the horizontal portion 230(b) in the gate length direction helps prevent process variation from allowing the adjacent electrically connected field poly feature 230 to cross or approach too close to the corner 211. A spacing in the gate width direction between the vertical portion 230(a) of the adjacent electrically connected field poly feature 230 to the active area edge 210(a) can be from $0.4W_1$ to $0.8W_1$.

Figure 2B:
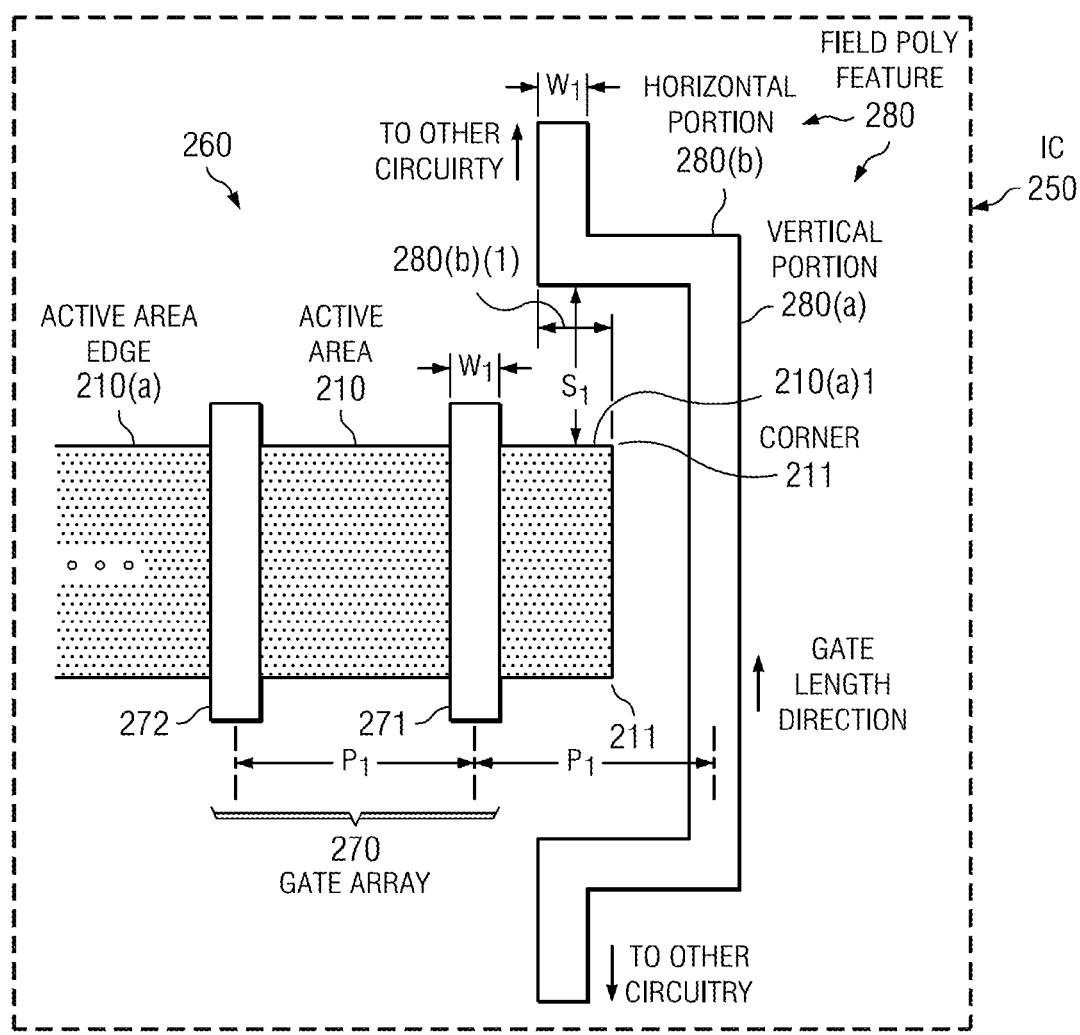
FIG. 2B is a simplified depiction of a printed poly gate level portion within an IC after gate patterning including a plurality of MOS transistors including adjacent electrically connected field poly features for gate pitch matching that maintain gate dielectric integrity, according to another disclosed embodiment.

FIG. 2B is a simplified depiction of a printed poly gate portion 260 within an IC 250 after gate patterning including a plurality of MOS transistors including adjacent electrically connected field poly features for gate pitch matching that maintain gate dielectric integrity, according to another disclosed embodiment. Gate portion 260 includes a first active poly gate feature 271 having a line width $W_1$ over an end of an active area 210, so that first active poly gate feature 271 is an end gate in gate array 270.

Second active poly gate feature 272 is an interior gate in gate array 270. Adjacent electrically connected field poly feature 280 is shown having a line width $W_1$. Adjacent electrically connected field poly feature 280 has a vertical portion 280(a) along a gate length direction of the first poly gate feature 271 and a horizontal portion 280(b) that is along the gate width direction of the first poly gate feature 271 that includes an extension portion 280(b)(1) that extends over an edge portion 210(a)(1) of the active area edge 210(a). Adjacent electrically connected field poly feature 280 is seen positioned to provide gate pitch matching ($P_1$) for gate array 270 as well as the minimum spacing 51. However, unlike adjacent electrically connected field poly feature 230 shown in FIG. 2A, adjacent electrically connected field poly feature 280 is not electrically connected to the first active poly gate feature 271 that it provides a gate assist feature for, but is instead electrically connected to other circuitry on the IC, such as to at least one other active gate.

Figure 3:
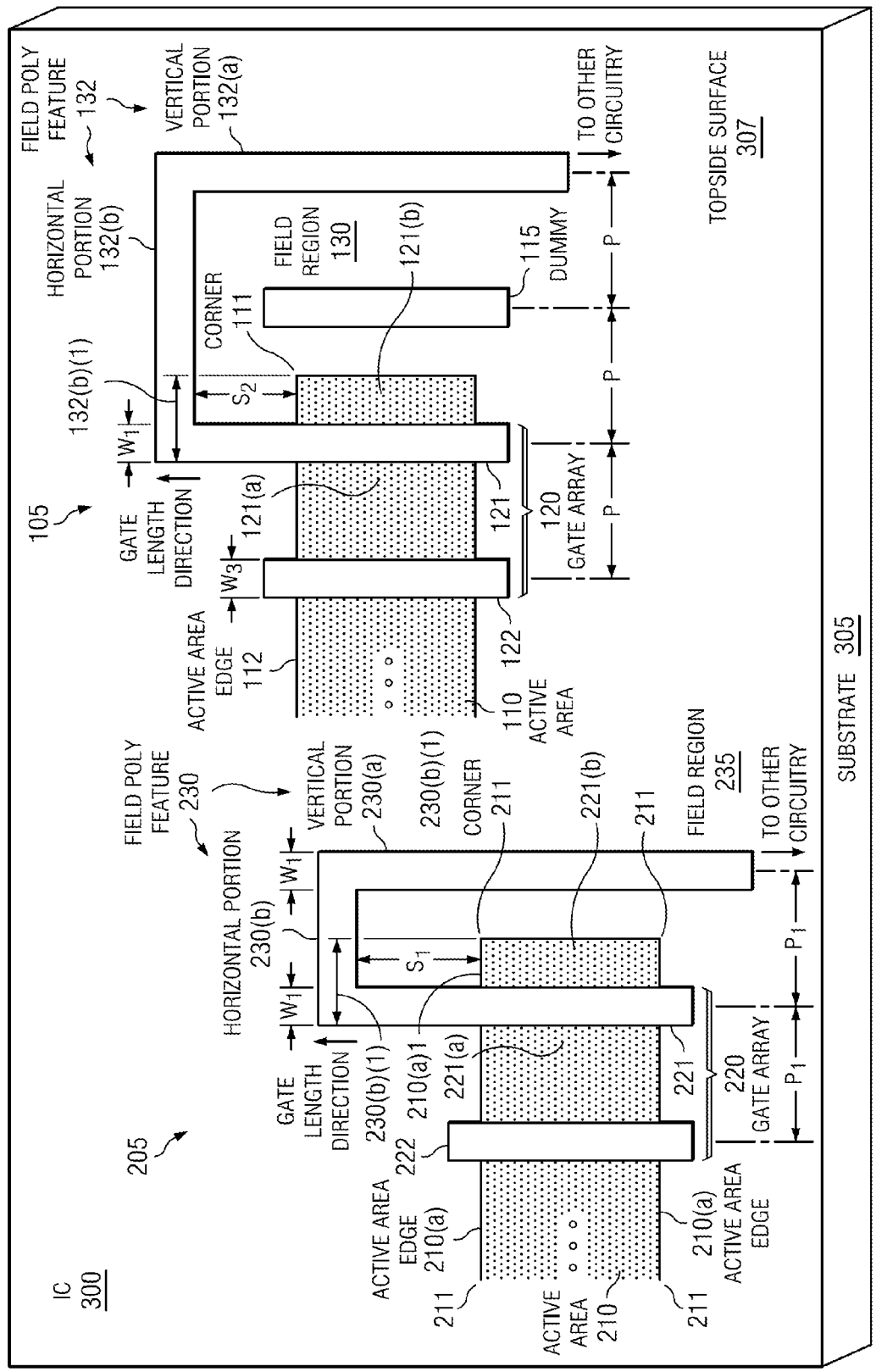
FIG. 3 is a simplified depiction an IC comprising a plurality of MOS transistors including a first gate portion comprising a first active poly gate feature having an adjacent electrically connected field poly feature based on the printed poly gate level portion shown in FIG. 2A and a second gate portion comprising a second active poly gate feature having an adjacent dummy field poly feature based on the printed poly gate level portion shown in FIG. 1, according to a disclosed embodiment.

Disclosed embodiments can comprise ICs that combine gate portions that have adjacent dummy field poly features such as shown in FIG. 1 with gate portions that include electrically connected adjacent field poly features such as the gate portions shown in FIG. 2A or 2B. FIG. 3 is a simplified depiction an example IC 300 comprising a plurality of MOS transistors including a first gate portion 205 comprising at least a first active poly gate feature 221 having an adjacent electrically connected field poly feature 230 based on the printed poly gate level portion 205 shown in FIG. 2A, and a second gate portion 105 comprising a second active poly gate feature 121 having an adjacent dummy field poly feature 115 based on the printed poly gate level portion 105 shown in FIG. 1, according to a disclosed embodiment.

IC 300 includes a substrate 305 having a topside semiconductor surface 307. Source and drain regions are shown on opposing sides of the active poly gate feature 121 as 121(*a*) and 121(*b*) and on opposing sides of the active poly gate feature 221 as 221(*a*) and 221(*b*).

According to a disclosed embodiment a lithography mask set is provided comprising a gate mask that provides adjacent electrically connected field poly as disclosed herein. As noted above, disclosed embodiments can include combinations of adjacent electrically connected field poly features and adjacent dummy field poly features, such as described above relative to IC 300 depicted in FIG. 3. As known in the art, the mask layout refers to a circuit schematic used to make a semiconductor device. The mask layout is used to form the respective masks and the mask design refers to geometric shapes on the mask layout that correspond to mask features formed on a mask and/or features formed in/on the substrate. The term "mask," as used herein, can be broadly interpreted as referring to a device comprising mask features that can be used to endow an incoming beam with a patterned cross-section, corresponding to a target pattern, that is to be created in/on a target portion of a substrate.

According to a disclosed embodiment a computer readable medium can be used to generate the masks including a gate mask to form the gate level portion of an IC. The computer readable medium can comprise program code stored on physical computer media that can configure a processor to perform various steps to generate masks used to make the IC.

Although reference is made herein to the use of disclosed embodiments in the manufacture of semiconductor devices, such as ICs, it is to be understood that disclosed embodiments have many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "reticle", "wafer", or "die" in this text can be considered as being replaced by the more general terms "mask", "substrate", and "target portion", respectively.

The active circuitry formed on the wafer semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. A method of forming an integrated circuit (IC), comprising:
    forming a first gate portion using a polysilicon (poly) mask comprising at least a first active poly gate feature having a line width $W_1$ over an end of a first active area, said first active area framed by a first active area edge, and at least a first adjacent active field poly feature having a line width $0.8W_1$ to $1.3W_1$ in a first field region positioned to maintain a gate pitch of said first active poly gate, said first adjacent active field poly feature electrically connected to at least one of said first active poly gate feature and another active gate feature, said first adjacent active field poly feature having a vertical portion along a gate length direction of said first active poly gate feature and a horizontal portion including a first extension portion along a gate width direction of said first active poly gate feature that extends over said first active area edge, wherein a first minimum spacing ($S_1$) is between said first extension portion and said first active area edge, and
    forming a second gate portion using said poly mask comprising a second active poly gate feature over an end of a second active area framed by a second active area edge electrically connected to a second field poly feature in a second field region having a vertical portion parallel to a gate length direction of said second active poly gate feature and a horizontal portion including a second extension portion that extends over said second active area edge along a gate width direction of said second active poly gate feature, and a dummy field poly feature interposed between said second active poly gate feature and said second field poly feature, wherein a second minimum spacing ($S_2$) is between said second extension portion and said second active area edge,
    wherein $S_1 \geq 1.25\ S_2$.

2. The method of claim 1, wherein a minimum spacing between said vertical portion of said first adjacent active field poly feature to said first active area edge is from $0.4W_1$ to $0.8W_1$.

3. The method of claim 1, wherein said first active poly gate feature and said first adjacent field poly feature are electrically isolated from one another.

4. The method of claim 1, wherein said first active poly gate feature and said first adjacent active field poly feature are electrically connected to one another by a poly comprising connection printed by said poly mask.

5. The method of claim 1, wherein said IC is formed on a substrate having a topside semiconductor surface, and wherein said first adjacent active field poly feature is positioned over trench isolation formed in said topside silicon comprising surface.

6. The method of claim 1, further comprising removing said dummy field poly feature.

7. The method of claim 1, wherein said $S_1$ is $\geq \lambda/4NA$+an overlay tolerance of a scanner used for said forming said first gate portion and forming said second gate portion.

8. A lithography mask set for forming an integrated circuits (IC), comprising:
    a polysilicon (poly) mask, said poly mask including:
        a first active poly gate feature having a line width $W_1$ over an end of a first active area, said first active area framed by a first active area edge, and at least a first adjacent active field poly feature having a line width $0.8W_1$ to $1.3W_1$ in a first field region positioned to maintain a gate pitch of said first active poly gate feature, said first adjacent active field poly feature connected to at least one of said first active poly gate feature and another active gate, said first field poly feature having a vertical portion along a gate length direction of said first active poly gate feature and a horizontal portion including a first extension portion along a gate width direction of said first active poly gate feature that extends over said first active area edge, wherein a first minimum spacing ($S_1$) is between said first extension portion and said first active area edge, and a second active poly gate feature over an end of a second active area framed by a second active area edge connected to a second field poly feature in a second field region having a vertical portion parallel to a gate length direction of said second active poly gate and a horizontal portion including a second extension portion that extends over said second active area edge along a gate width direction of said second active poly gate feature, and a dummy field poly feature interposed between said second active poly gate feature and said second field poly feature, wherein a second minimum spacing ($S_2$) is between said second extension portion and said second active area edge, wherein $S_1 \geq 1.25 S_2$.

9. The lithography mask set of claim 8, wherein a minimum spacing between said vertical portion of said first adjacent active field poly feature to said first active area edge is from $0.4W_1$ to $0.8W_1$.

10. The lithography mask set of claim 8, wherein said first active poly gate feature and said first adjacent active field poly feature are connected on said poly mask.

11. The lithography mask set of claim 8, wherein said first active poly gate feature and said first adjacent active field poly feature are not connected on said poly mask.

12. An integrated circuit (IC), comprising:
a substrate having a topside semiconductor surface including at least one active area and at least one field region;
a plurality of MOS transistors formed with said active area, comprising:
a first gate portion comprising a first active poly gate feature having a line width $W_1$ over an end of a first active area, said first active area framed by a first active area edge, and at least a first adjacent active field poly feature having a line width $0.8W_1$ to $1.3W_1$ in a first field region positioned to maintain a gate pitch of said first active poly gate feature, said first adjacent active field poly feature electrically connected to at least one of said first active poly gate feature and another active gate feature, said first adjacent active field poly feature having a vertical portion along a gate length direction of said first active poly gate feature and a horizontal portion including a first extension portion along a gate width direction of said first active poly gate feature that extends over said first active area edge, wherein a first minimum spacing ($S_1$) is between said first extension portion and said first active area edge;

a second gate portion comprising a second active poly gate feature over an end of a second active area framed by a second active area edge electrically connected to a second field poly feature in a second field region having a vertical portion parallel to a gate length direction of said second active poly gate and a horizontal portion including a second extension portion that extends over said second active area edge along a gate width direction of said second active poly gate feature, and a dummy field poly feature interposed between said second active poly gate feature and said second field poly feature, wherein a second minimum spacing ($S_2$) is between said second extension portion and said second active area edge, wherein $S_1 \geq 1.25\ S_2$, and a source and a drain region on opposing sides of said first active poly gate feature and said second active poly gate feature.

13. The IC of claim 12, wherein a minimum spacing between said vertical portion of said first adjacent active field poly feature to said first active area edge is from $0.4W_1$ to $0.8W_1$.

14. The IC of claim 12, wherein said first active poly gate feature and said first adjacent active field poly feature are electrically connected to one another by a poly comprising connection.

15. The IC of claim 12, wherein said first active poly gate feature and said first adjacent active field poly feature are electrically isolated from one another.

* * * * *